United States Patent
Miczek et al.

(10) Patent No.: US 7,059,046 B2
(45) Date of Patent: Jun. 13, 2006

(54) METHOD FOR PRODUCING A CAPTIVE WIRED TEST FIXTURE AND FIXTURE THEREFOR

(75) Inventors: Gregory Miczek, Gansovoort, NY (US); Thomas Newhall, Clifton Park, NY (US); Gary St. Onge, Ballston Lake, NY (US); David P. Rogers, Clifton Park, NY (US)

(73) Assignee: Delaware Capital Formation, Inc., Wilmington, DE (US)

( * ) Notice: Subject to any disclaimer, the term of this patent is extended or adjusted under 35 U.S.C. 154(b) by 275 days.

(21) Appl. No.: 10/454,930

(22) Filed: Jun. 5, 2003

(65) Prior Publication Data

US 2003/0234640 A1 Dec. 25, 2003

Related U.S. Application Data

(60) Provisional application No. 60/391,097, filed on Jun. 24, 2002.

(51) Int. Cl.
 *H01R 9/00* (2006.01)
(52) U.S. Cl. .............................. 29/842; 29/825; 29/830; 29/845
(58) Field of Classification Search .................. 29/825, 29/842, 845, 874, 876
 See application file for complete search history.

(56) References Cited

U.S. PATENT DOCUMENTS

| | | | |
|---|---|---|---|
| 4,535,536 A * | 8/1985 | Wyss | 29/845 |
| 4,774,459 A * | 9/1988 | Maelzer et al. | 324/754 |
| 4,788,496 A * | 11/1988 | Maelzer et al. | 324/754 |
| 5,767,692 A * | 6/1998 | Antonello et al. | 324/761 |
| 5,773,988 A * | 6/1998 | Sayre et al. | 324/761 |
| 5,818,248 A * | 10/1998 | St. Onge | 324/761 |
| 5,945,836 A * | 8/1999 | Sayre et al. | 324/761 |
| 6,407,565 B1 * | 6/2002 | Sayre et al. | 324/755 |
| 6,424,163 B1 * | 7/2002 | Ott | 324/754 |
| 6,559,664 B1 * | 5/2003 | DeSimone | 324/754 |
| 6,878,530 B1 * | 4/2005 | Yang | 435/91.2 |

FOREIGN PATENT DOCUMENTS

| | | |
|---|---|---|
| DE | 4337500 A1 | 5/1995 |
| GB | 2086670 A | 5/1982 |

OTHER PUBLICATIONS

European Search Report dated Oct. 16, 2003; European Patent Application No. 03253864.7.

* cited by examiner

*Primary Examiner*—Carl J. Arbes
(74) *Attorney, Agent, or Firm*—Christie, Parker & Hale, LLP.

(57) ABSTRACT

A method for wiring a test fixture comprised of two parallel fixture plates wherein the wires are wired randomly from locations on one plate to locations on a second plate using a system of software algorithms and positioning apparatus to control the motion of one plate relative to the other to allow the wires to be passed directly through the hole locations to be wired together, while previously woven locations are allowed to slide in the hole in the fixture plate to allow reaching subsequent hole pair locations. After the fixture is wired, a termination is added to the wire end emerging from the hole in the fixture plates. The resultant assembly consists of contacts on one outer surface electrically connected to contacts on a second outer surface with all of the wiring sandwiched between the two fixture plates.

8 Claims, 4 Drawing Sheets

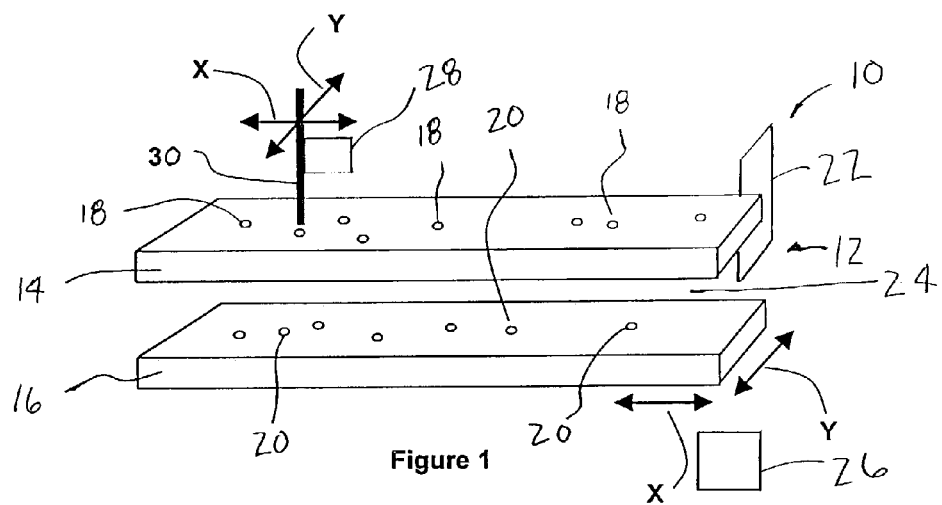
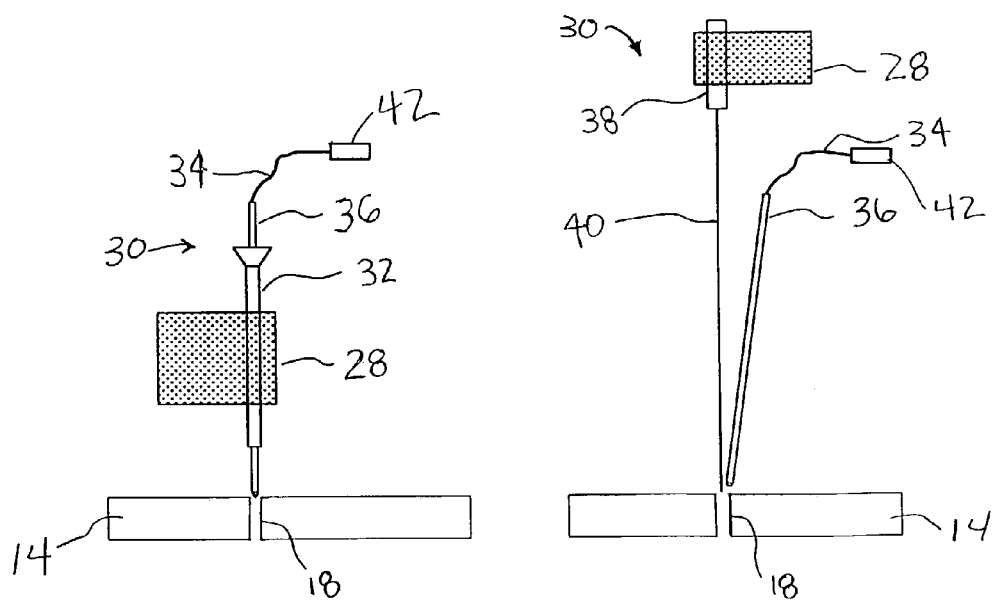
Figure 1
Fig. 2A
Fig. 2B

METHOD FOR PRODUCING A CAPTIVE WIRED TEST FIXTURE AND FIXTURE THEREFOR

CROSS-REFERENCE TO RELATED APPLICATION(S)

This applications claims priority from U.S. Provisional Application No. 60/391,097 filed Jun. 24, 2002.

FIELD OF THE INVENTION

Automatic test equipment for checking printed circuit boards has long involved use of a "bed of nails" test fixture in which the circuit board is mounted during testing. This test fixture includes a large number of nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high-speed electronic test analyzer which detects continuity or lack of continuity between various test points in the circuits on the board.

Various approaches have been used in the past for bringing the test probes and the circuit board under test into pressure contact for testing. One class of these fixtures is a "wired test fixture" in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. Customized wire test fixtures of similar construction also can be made by using mechanical means other than vacuum to apply the spring force necessary for compressing the board into contact with the probes during testing.

The wire-wrapping or other connection of test probes, interface pins and transfer pins for use in a wired test fixture can be time intensive. However, customized wired test fixtures are particularly useful in testing circuit boards with complex arrangements of test points and low-volume production boards where larger and more complex and expensive electronic test analyzers are not practical. Consequently, a need exists for an improved method for wiring a test fixture.

SUMMARY OF THE INVENTION

The present invention is directed to a method for producing a captive wire test fixture wherein the fixture includes an upper or probe plate spaced from and coplanar with a lower or interface plate. Depending upon the specific fixture, the upper plate can be a fixture well containing a plurality of gold-plated posts for a double-ended receptacle-style fixture, a stealth-style fixture, or probe receptacles for standard fixtures, or socket contacts for plug-in probes drilled at probe locations unique to the unit under test. The lower plate is the interference pin carrier plate, which contains the drill pattern for the target tester interface locations. The fixture wiring is applied from the upper plate to the desired location in the lower plate by a software controlled positioner which moves the plates into position to weave the wiring between the two plates.

The upper and lower plates are positioned on a wiring frame with the plates being coplanar and spaced apart from each other a sufficient distance to allow the wires to freely move between the plates. Typically, the upper or probe plate remains stationary, and the interface plate is connected to an X-Y positioner capable of positioning the hole pattern in the lower or interference plate to the outer limits of the hold pattern in the upper or probe plate. A second X-Y positioner is positioned above the top plate to supply a pre-assembled wire to the desired hole location through a launch tube positioned in the desired hole in the probe plate. Alternatively, the second X-Y positioner is utilized to position a laser, which illuminates the desired hole location for manual insertion of the wire.

The lower X-Y positioner includes software which is programmed to order the wiring to allow the relative motion between the two plates to progress from the longest to the shortest distance, also maintaining a non-rotational model to minimize tangling of the wires as the wiring process progresses. The software algorithms pair up the two and from wiring information into coordinate data for positioning the lower or interference plate relative to the top or probe plate, and positioning the wire or laser to the proper location above the top or probe plate.

BRIEF DESCRIPTION OF THE DRAWINGS

FIG. 1 is a schematic perspective illustration of the apparatus for wiring a test fixture of the present invention;

FIG. 2A is a front schematic detail view of the top X-Y positioner of the apparatus of FIG. 1;

FIG. 2B is a front schematic detail view of an alternative top X-Y positioner of the apparatus of FIG. 1;

DETAILED DESCRIPTION OF THE DRAWINGS

Figure 3:
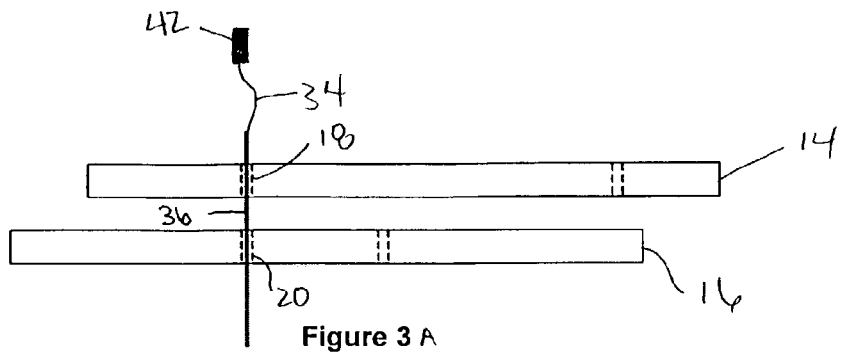
FIGS. 3A–G are process views of the wiring apparatus of FIG. 1.
Figure 3B:
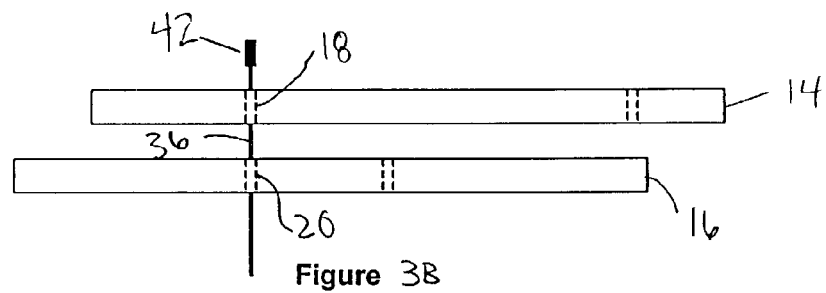

FIG. 1 illustrates a wired test fixture wiring apparatus 10 of the present invention. The wiring apparatus is utilized for a test fixture 12 having a first or upper plate 14 and a second or lower plate 16 spaced from the upper plate 14. The upper plate can be a fixture well, which would contain either gold-plated posts for a double-ended receptacle-style fixture, a stealth-style fixture, or probe receptacles for standard test fixtures. Alternatively, the probe plate can have socket contacts for plug-in probes. The gold-plated posts, probe receptacles or socket contacts (not shown) are positioned on the probe plate in holes 18 extending through the probe plate at test site locations which correspond to the specific unit under test. The second or lower plate 16, also described herein as an interface plate, contains a plurality of holes 20 extending through the plate which corresponds to the target tester interface locations. As will be discussed in more detail herein, wiring is applied from the upper or probe plate 14 to the desired location in the interface plate 16 by software and hardware, which moves the plates into position to weave the wiring between the two plates.

The probe plate and the interface plate are positioned on a wiring frame 22 wherein the two plates are coplanar and spaced apart from each other a sufficient distance to allow wires to freely move in the space 24 between the two plates. The probe plate 14 is held in a stationary position, and the interface plate 16 is connected to a first X-Y positioner 26 capable of positioning the hole pattern in the interface plate and the X-Y axes to the outer limits of the hole pattern of the probe plate. A second X-Y positioner 28 is positioned above the probe plate to position a wiring apparatus 30 above the holes in the probe plate to assist in wiring of the fixture.

As shown in FIG. 2A, the wiring apparatus 30 is a launch tube 32 used to guide the wire 34 through hole 18 in probe plate 14. Wire 34 has a rigid stylus 36 attached to the end of the wire for insertion through the launch tube to guide the wire into hole 18. FIG. 2B shows an alternative wiring apparatus 30 which comprises a laser 38 connected to X-Y positioner 28, which projects a laser beam 40 into hole 18 in plate 14 to illuminate hole and serve as a guide for wire 34 to be inserted by stylus 36.

The wire 34 is pre-assembled and consists of a contact pin 42 at one end of the wire opposite the stylus 36. The stylus is of sufficient length to pass through holes 18 and 20 in both the probe plate and the interface plate. The stylus is of a diameter small enough to pass through the holes in the plates and has a rounded tip to allow it to pass cleanly through the wiring mass that will develop between the plates. The wire preferably is, but not limited to, solid magnet wire to reduce the mass of the wiring over standard thicker insulated Kynar or similar insulated wire. The pre-assembled wire and attached stylus are sent through the launch tube before being directed to the holes in the plates. The launch tube 32 must be of sufficient diameter to allow passage of the contact pin 42 located at the end of the wire. Contact in 42 also could be a receptacle or other contact attached to the wire. The stylus consists of a hollow tube, such as a hypodermic tubing, wherein the end of the wire is inserted into the inner diameter of the stylus and held by friction. Once the wire is in place through the lower plate, the stylus can be removed and reused. In the alternative method shown in FIG. 2B, the laser beam 40 illuminates the proper hold location for manual insertion of the stylus.

Figure 3C:
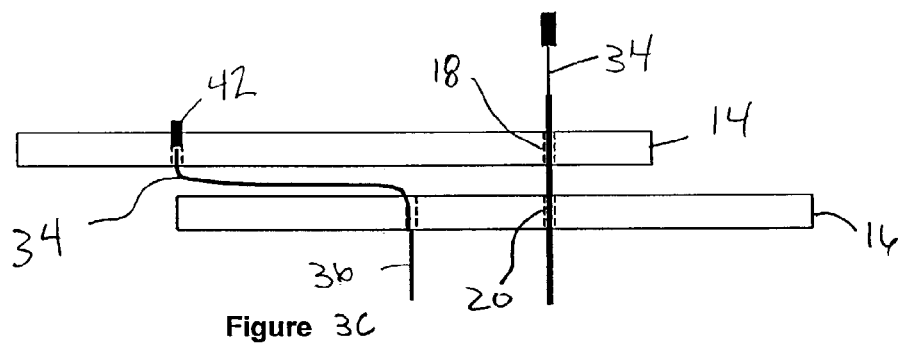

The wiring progression is illustrated in FIGS. 3A–G. As shown in FIG. 3A, the wiring operation begins by positioning the "from" hole 18 in probe plate 14 over the "to" hole 20 in the interface plate by moving the interface plate with positioner 26 so that the holes are aligned, beginning with the longest wire 34 for the fixture. The positioner 26 is placed to identify the correct interface hole location where a launch tube or a laser pointer is employed for identification of the holes. The pre-assembled wire is fed using the attached stylus through the probe plate and the interface plate. The wire 34 is pulled through the plates, FIG. 3B, until the upper probe contact 42 is pressed into hole 18 and probe plate 14, a shown in FIG. 3C. The stylus 36 is left hanging below the interface plate. The positioner 26 moves to the next ordered "to" and "from" locations, as shown in FIG. 3C, and the operation is repeated. The previously wired locations traverse freely through the hole 20 in the interface place as the interface plate is moved to successive locations. This process continues until all of the required wires are in place. Although the figures illustrate only two wires, it is to be understood that any number of wires can be installed depending upon the specific requirements of the unit under test.

Figure 3D:
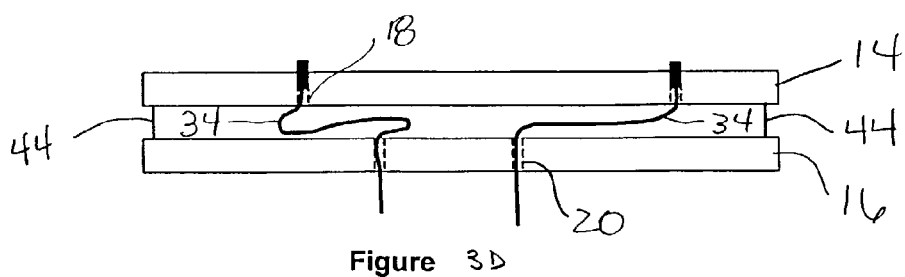
Figure 3E:
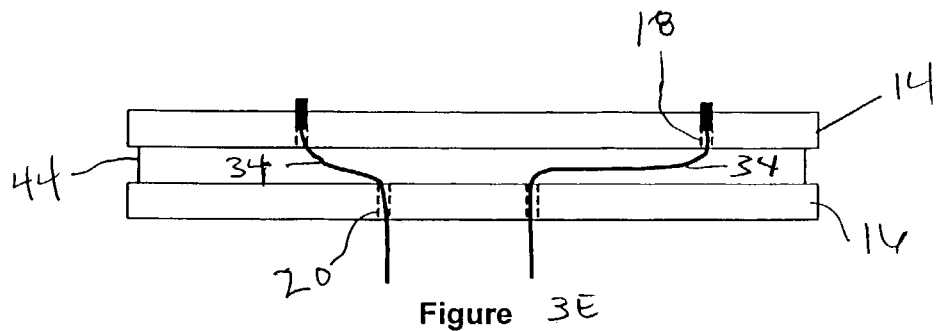
Figure 3F:
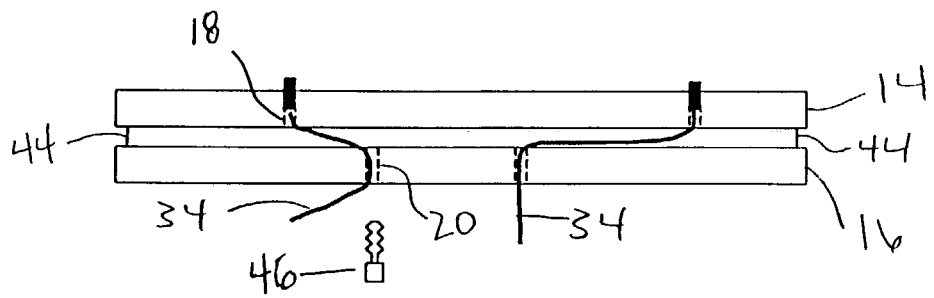
Figure 3G:
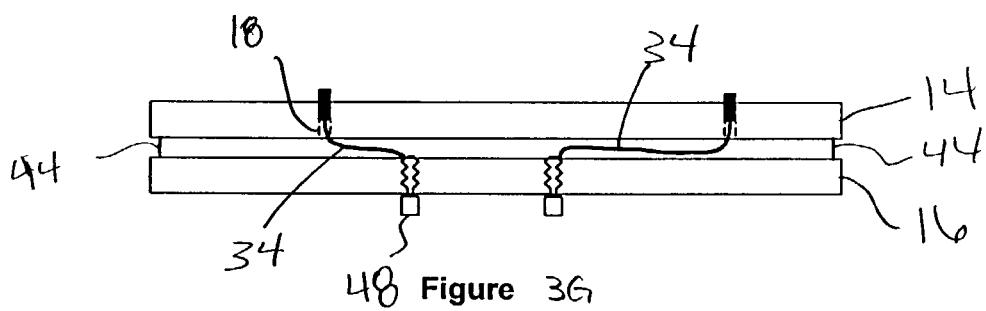

Once the wiring is completed, the two plates are returned to their intended fixed position as shown in FIG. 3D and pinned 44 together. All excess slack is removed from the wiring sandwiched between the plates by gently pulling the wires as shown in FIG. 3E. The space between the two plates is minimized as the excess wire slack is removed, as shown in FIG. 3F. Electrical contacts 46 are then applied to the interference plate side by any number of methods, including, but not limited to, inserting a serrated contact into hole 20. The serrated contact 46 will simultaneously pierce through the insulation on the wire and cut the excess wire when it is inserted. Alternate methods involve IDC termination of the wire to a contact 48, which is then inserted into the interference plate, as shown in FIG. 3G. Other methods of making electrical contact between the insulated wire and the interface contact prior to or during installation of the interference contact is also contemplated by the present invention.

To accomplish repairs, changes or additions to the fixture, a number of options are available. An additional probe can easily be added at a free location on the probe plate, by drilling a blind hole in the probe plate and then inserting a short contact. This contact will have a pre-attached wire, which then can be routed on the top surface of the probe plate to a clear location, which is a location void of wires in the wiring sandwich, where a through hole can be drilled. The wire is passed through the hole and then routed to the interference plate surface to the desired location, where it is terminated to an interference post. This termination can be soldered, welded, or electrically connected by IDC process prior or during installation of the interference contact pin.

Removal of a wire first involves the removal of the interference contact, followed by removal of the probe contact, then pulling the pre-attached wire completely out of the assembly. Replacement will involve the surface wiring technique previously described.

Figure 4:
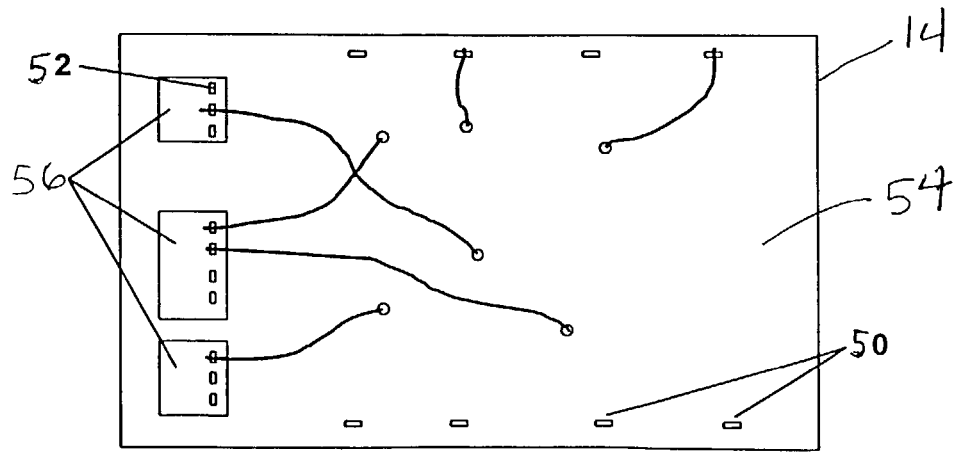
FIG. 4 is a plan view of the back side of the probe plate of the apparatus of FIG. 1.

As shown in FIG. 4, ground and power connections are made to the probe plate prior to the wire weaving operation. Fields of power and ground connections 50 and 52 are placed around the periphery of the back side of 54 of the probe plate 14, consisting of, but not limited to, IDC terminals for termination of the pre-assembled wires previously described. The back side 54 of the probe plate is a tinned copper plane, with islands 56 for the power connections. The stylus is used to route the wire through the proper probe hole location, and the wire is looped over to the power or ground terminal, pointed to by the laser pointer, then terminated. The power and ground fields are pre-wired to areas accessible after the wire weaving operation is complete, to allow connection to the appropriate points on the interface plate. Similarly, an "opens" multiplexer can be mounted in this area of the probe plate to allow twisted pair connections to be made from bottom side opens sensor plate locations to the multiplexer prior to any of the described wiring done between the probe and interface plates.

A second method for wiring of the probe plate and the interface plate can be accomplished by orienting the two plates side by side with the termination sides of both plates facing in the same direction. The pre-terminated wire is fed through the first plate using the location methods previously described and then sent back through the end location in the second plate. This operation continues until all of the wires are in place, the ends of the wires hanging from the terminating hole. The two plates are then reoriented with the terminating sides facing opposite directions. The excess wire slack is removed at 90°, 30°, and parallel orientations. Once all of the excess wire is pulled through, the two plates are mechanically attached, and the remaining terminations are inserted to captivate the loose wires. The resultant assembly is the same as previously described and shown in FIG. 3G.

Figure 5:
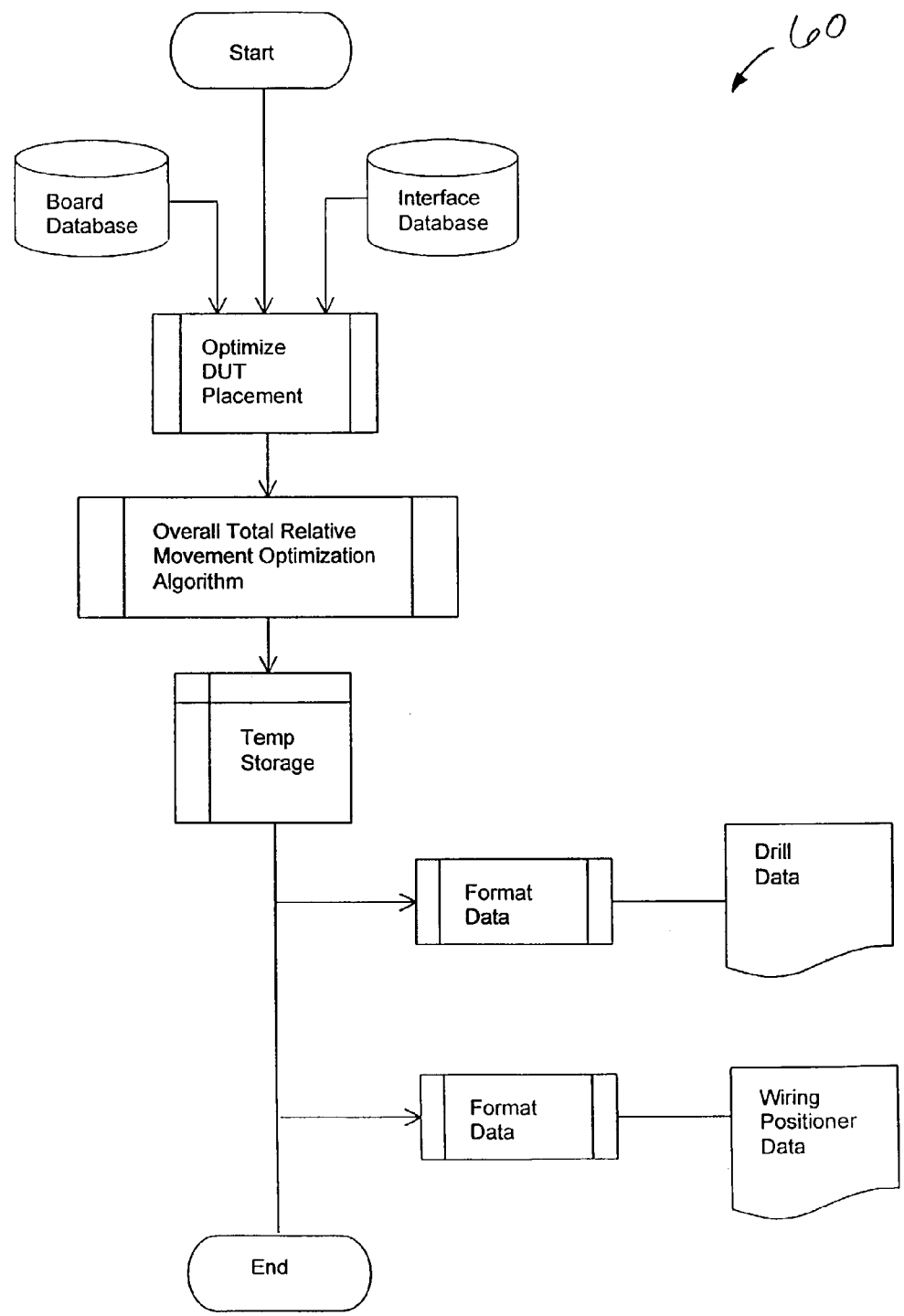
FIG. 5 is a flow diagram of the software for the apparatus of FIG. 1.

The wiring apparatus 10 includes a computer program 60 as shown in the flow chart shown in FIG. 5. Software algorithms are employed to order the wiring to allow the relative motion between the two plates to progress from the longest to shortest moves, also maintaining a non-rotational model to minimize tangling of the wires as it progresses. The algorithms pair up the "to" and "from" wiring information into coordinate data for positioning the interference plate relative to the probe plate, and positioning the stylus guide or laser to the proper location on the probe plate. The program software algorithms are also used to order wiring progression, such that the slack can be pulled with minimal crossing and intermingling of wires behind one plate, which would limit the ability of removing wire slack.

Industry standard fixture software processing is done to the unit under test data and connection data to the test system interface. Prior to producing the set of fixture output files for drilling and wiring, the data is processed through a set of software algorithms. A first algorithm will order the wires in such way that the relative motion between the two plates progress from the longest to the shortest moves, also maintaining a non-rotational model to minimize tangling of the wires as it progresses. A second algorithm optimizes the placement of the unit under test over the interface such that the result from the first algorithm is an overall minimum plate movement and wire length. These algorithms pair up the "to" and "from" wiring information into coordinate data for positioning the interface plate relative to the probe plate, and positioning the stylus guide or laser to the proper location on the probe plate. Following this process, a format wiring file is produced that will be used to drive the positioners which can be a CNC controlled fixture wiring machine that will actually move the plates and laser pointer in the properly optimized sequence. In practice, the wiring progression is demonstrated as previously disclosed in the drawings wherein the wiring operation begins by positioning the "from" probe plate hole over the "to" interface plate, beginning with the longest wire. The rear positioner is placed to identify the correct interface hole location wherein a longitudinal laser pointer is employed for this identification. A pre-assembled wire is fed using the attached stylus through the interface plate, and the associated hole in the probe plate. The wire length is pulled through and the upper probe contact is pressed into place. The stylus is left hanging on the probe plate side. The positioners move to the next ordered "to" and "from" locations and the operation is repeated. The previously wired locations traverse freely through the hole in the interface plate as the interface plate is moved to successive locations. This process continues until all of the required wires are in place.

With respect to the second method of wiring of the probe plate previously discussed, the software algorithms are used to order wiring progression such that the slack from the wires can be pulled with minimal crossing and intermingling of the wires behind one plate, which would limit the ability of removing wire slack.

Benefits of the present invention include a wiring technique which employs enameled magnet wire to reduce wiring bulk, uses insulation displacement contact (IDC) technology to eliminate in situ wire stripping operations and wire wrapping operations, employs a positioning system to move one plate, placing the "to" and "from" hole locations on a test fixture probe plate and interference plate concentrically, to allow passing a wire through both plates simultaneously. The invention further utilizes a stylus attached to a fixture wire to allow threading the wire through the plates and the wiring mass, uses software algorithms to produce an ordered progression of the wiring to minimize wire flexure and entangling of the wiring between the plates as the wiring progresses, uses a tapered, barbed contact to simultaneously cut through the enameled insulation of the magnet wire, or any other wire insulation used, and retain the contact in the plate, using the elastic deformation of the plate material to maintain a gas-type electrical connection. The barbed contact additionally cuts the wire at the surface of the plate as the contact is pressed to a final position. The invention further employs the use of probe sockets, where the socket is of the same or smaller diameter as the probe body. The probe body has a reduced diameter plug at the base of the probe. The probes then plug into the sockets ensuring electrical contact and probe centering. The invention further incorporates IDS fields on the bottom surface of the probe plate to wire the power and ground probe connections.

Although the present invention has been described with respect to alternative methods herein, it is not to be so limited, since changes and modifications can be made which are within the scope of the invention as hereinafter claimed. For example, the wiring techniques can be applied to backplanes, probe cards, or any other use requiring a wired assembly similar in application to a printed circuit board.

What is claimed is:

1. A method for wiring a test fixture comprising:
positioning a first plate having a plurality of first wiring holes extending therethrough in a stationary position;
moving a second plate having a plurality of second wiring holes extending therethrough to axially align a second wiring hole with a first wiring hole;
passing a wire through the first hole and the second hole; and
terminating an end of the wire on the second plate.

2. The method of claim 1, wherein the passing of a wire includes positioning a launch tube above the first hole and passing a stylus attached to the wire through the launch tube.

3. The method of claim 1, wherein the passing of a wire includes positioning a laser above the first hole to illuminate the first hole and passing a stylus attached to the wire through the first and second holes.

4. The method of claim 1, further including pressing a first contact attached to an end of the wire into the first hole.

5. The method of claim 4, further comprising moving the second plate to a second wiring position and passing a wire through subsequently aligned holes in the first and second plates.

6. The method of claim 5, further comprising repositioning the plates to a final position and pulling the slack from the wires between the plates.

7. The method of claim 1, wherein terminating an end of the wire is by a barbed electrical contact.

8. The method of claim 1, wherein the second plate is moved by a computer controlled positioner programmed to order progression of wiring to minimize wire flexure and entangling of the wires between the first and second plate.

* * * * *